US00RE43638E

(19) United States
(12) Reissued Patent
Czarnecki

(10) Patent Number: US RE43,638 E
(45) Date of Reissued Patent: Sep. 11, 2012

(54) UTILITY POWER RESTORATION INDICATOR FOR POWER MANAGEMENT SYSTEM

(75) Inventor: Neil A. Czarnecki, Mt. Pleasant, WI (US)

(73) Assignee: Reliance Controls Corporation, Racine, WI (US)

(21) Appl. No.: 13/163,099

(22) Filed: Jun. 17, 2011

Related U.S. Patent Documents

Reissue of:
(64) Patent No.: 7,800,512
Issued: Sep. 21, 2010
Appl. No.: 11/801,170
Filed: May 9, 2007

U.S. Applications:
(60) Provisional application No. 60/746,904, filed on May 10, 2006.

(51) Int. Cl.
*G08B 23/00* (2006.01)

(52) U.S. Cl. ..... 340/693.1; 340/638; 340/657; 340/660; 307/64; 324/117 R

(58) Field of Classification Search ..... 340/693.1, 340/660, 638, 641, 647, 652, 657, 870.02, 340/665, 639, 693.2; 307/64, 85, 86; 324/126, 117 R, 107, 142
See application file for complete search history.

(56) References Cited

U.S. PATENT DOCUMENTS

| | | | | |
|---|---|---|---|---|
| 4,780,910 | A * | 10/1988 | Huddleston et al. | 398/109 |
| 5,079,715 | A * | 1/1992 | Venkataraman et al. | 702/62 |
| 6,531,790 | B2 * | 3/2003 | Panuce et al. | 307/64 |
| 6,586,923 | B2 | 7/2003 | Seike | |
| 6,593,670 | B2 * | 7/2003 | Anderson | 307/64 |
| 6,867,958 | B2 * | 3/2005 | McClure et al. | 361/72 |
| 6,940,956 | B1 * | 9/2005 | Leach | 379/106.01 |
| 6,949,921 | B1 * | 9/2005 | Feight et al. | 324/127 |
| 6,982,650 | B1 * | 1/2006 | Asplund | 340/870.02 |
| 7,119,457 | B1 * | 10/2006 | Flegel | 307/64 |
| 7,308,370 | B2 * | 12/2007 | Mason et al. | 702/65 |

* cited by examiner

*Primary Examiner* — Anh V La
(74) *Attorney, Agent, or Firm* — Boyle Fredrickson, S.C.

(57) ABSTRACT

A system for indicating a power condition in a conductor includes an indicator constructed to provide notification to a user of a utility power condition, and a sensor non-electrically connected to a utility conductor to control operation of the indicator in response to detection of power in the utility conductor.

34 Claims, 3 Drawing Sheets

UTILITY POWER RESTORATION INDICATOR FOR POWER MANAGEMENT SYSTEM

Matter enclosed in heavy brackets [ ] appears in the original patent but forms no part of this reissue specification; matter printed in italics indicates the additions made by reissue.

CROSS-REFERENCE TO RELATED APPLICATION

This application claims the benefit of U.S. Ser. No. 60/746,904, filed May 10, 2006, the disclosure of which is incorporated herein by reference.

FIELD OF THE INVENTION

The present invention relates to a power indicator that provides an indication that primary power is being supplied to a load center. More particularly, the invention relates to a power indicator that determines the presence of primary or utility power to a load center without tapping into the current path between the primary power supply and the load center.

BACKGROUND OF THE INVENTION

A building typically has a load center or "breaker box" that distributes power from a primary power supply, such as a utility power supply, to various circuits within the building. The load center generally includes a main breaker, which selectively connects/disconnects the individual circuits or branches of the load center to/from the primary power supply. Increasingly, transfer panels or switches are being used so that critical or emergency circuits, such as those that feed power to water and waste management systems, refrigeration systems, and medical equipment, are sufficiently powered during interruption or failure of the primary power supply. The transfer panel, similar to the load center, will include individual circuits that are connected to the primary power supply through a transfer switch, similar in operation to the main breaker of the load center. During normal operation of the primary power supply, primary power is delivered to the circuits of the load center and the transfer panel. However, during interruption of primary power, the transfer switch disconnects the circuits of the transfer panel from the primary power supply and connects those circuits to an auxiliary power supply, such as an electric power generator.

Transfer switches are generally categorized as either manual transfer switches or automatic transfer switches. Automatic transfer switches automatically detect the interruption of primary power, automatically connect the critical or emergency circuits to the auxiliary power supply, and automatically initiate operation of the auxiliary power supply. Moreover, automatic transfer switches will automatically restore connection of the critical or emergency circuits to the primary power supply when primary power is restored and shut-down the auxiliary power supply. With manual transfer switches, the aforementioned steps are carried out manually by an operator.

Specifically, upon interruption of primary power, the main breaker must be manually disconnected or turned "OFF" and the circuits connected to the auxiliary power supply. The main breaker is disconnected to prevent power generated by the auxiliary power supply from back-feeding through to the primary power supply. Thus, even when primary power has been restored, the load center remains disconnected from the primary power supply. As a result, the user, e.g., homeowner, is not readily made aware that primary power has been restored and that the auxiliary power supply can thereby be turned "OFF" or shut down and the circuits of the building may be reconnected to the primary power supply. Conventionally, to determine if primary power has been restored, a user must shut down the auxiliary power supply and reconnect the load center to the primary power supply. If the load center circuits are energized, primary power has been restored. If not, the user must then manually disconnect the load center from the primary power supply and reinitiate the auxiliary power supply to provide power to the transfer switch circuits, as described above. Unless the user is ostensibly aware that primary power has been restored, this technique can be hit-and miss, and therefore considerably inefficient.

Additionally, in many applications, the auxiliary power supply is a fuel-driven generator. Thus, if auxiliary power is used to power the critical or emergency circuits notwithstanding the restoration of primary power, the fuel-driven generator may be run much longer than needed thereby increasing its operational costs.

Therefore, there is a need for a device that detects primary power delivery to a load center and provides a suitable indication to a user. Such a device is particularly needed in the context of manual transfer switches in order to provide a signal to a user that primary power has been restored, that the auxiliary power supply may be shut down, and that the load center may be reconnected to the primary power supply.

SUMMARY OF THE INVENTION

The present invention is directed to a power indicator that overcomes the aforementioned drawbacks. In one aspect, the power indicator is electrically isolated from the circuits connected to the primary power supply, and signals an alert that primary power has been restored. The alert may include an audio alert or a visual alert. The power indicator is designed to sense the electromagnetic field around the wires that connect a load center to the primary power supply. Moreover, the electromagnetic field is sensed without direct contact with the current carrying components of the load center or the primary power supply. In one embodiment, the power indicator includes a coil of wire that is wrapped around a supply wire that connects the load center to the primary power supply. When the power indicator wire senses an electromagnetic field from a voltage at the supply wire, the power indicator provides an appropriate audio and/or visual alert signaling that primary power is available at the load center. In the context of an auxiliary power supply arrangement, the alert may signal a user that use of the auxiliary power supply may be terminated. Additionally, the power indicator may include circuitry for wirelessly communicating with a remote receiver that may be carried by a user or conveniently stationed remote from load center. This allows the user to be signaled that primary power is available at the load center without requiring the user to be proximate the load center. In one aspect, the power indicator is powered by a battery. The battery may also be a rechargeable battery that is charged by current induced in a separate sensing coil when the primary power supply is operational. Alternately, the power indicator may be powered by the auxiliary power supply.

Accordingly, in one aspect, the present invention is directed to a power indicator that senses primary power available at a load center without direct electrical contact with the current carrying components of the load center or the primary power supply.

In another aspect, the power indicator provides an audio or visual signal when primary power at the load center is sensed. In one embodiment, primary power at the load center is sensed by a coil wrapped around an input power line that provides primary power from the primary power supply to the load center.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention will be described with respect to a power indicator that may be used to sense power at a load, such as a load center or "breaker box" of a dwelling, building, or other structure. The power indicator will be described and shown as being independent of the load center; however, it is understood that the power indicator may be integrated with the load center. Moreover, it is contemplated that the power indicator may similarly be integrated with a transfer switch.

Figure 1:
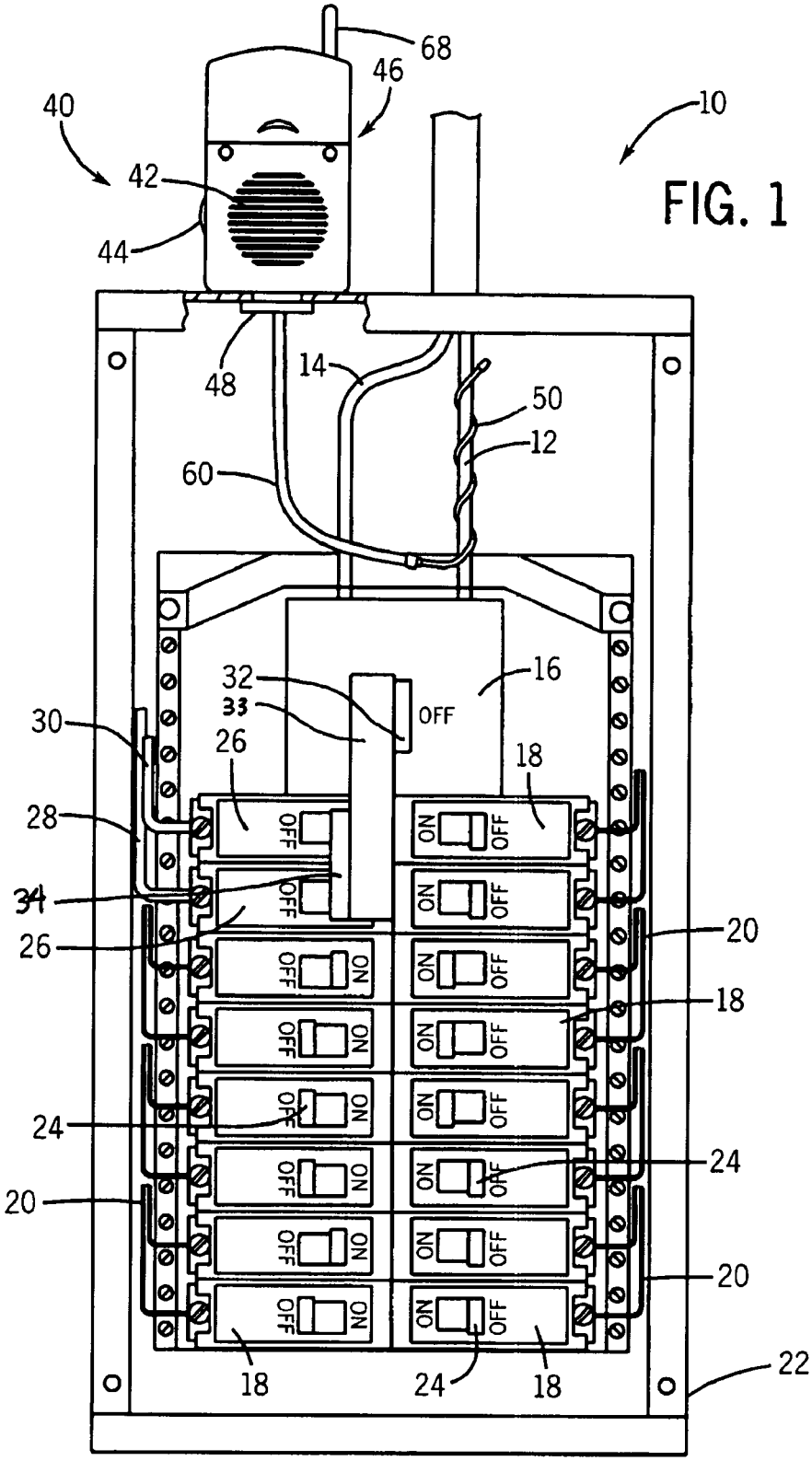
FIG. 1 is an elevational view of an exemplary load center assembly having a power indicator in accordance with the present invention.

FIG. 1 shows a load center 10 having utility conductors 12, 14 that communicate power from a utility to load center 10. Understandably, the number and size of utility conductors 12, 14 will depend upon the amount of utility power intended or desired to be provided to load center 10. A main breaker 16 electrically connects and disconnects utility conductors 12, 14 from a series of load breakers 18. Load breakers 18 electrically connect or disconnect respective load conductors 20, which extend beyond a housing 22 of load center 10 to respective branches or circuits to which various electrical loads are connected, such as lights, outlets, electronics, and the like. Each of load breakers 18 includes an ON/OFF switch 24, which is used to connect and disconnect load conductors 20 from utility conductors 12, 14. Main breaker 16 electrically connects and disconnects all of load breakers 18 from power communicated from utility conductors 12, 14. Similarly, each of load breakers 18 electrically connects or disconnects the associated load conductor 20 from power provided from utility conductors 12, 14. A generator breaker 26 electrically connects or disconnects generator conductors 28, 30 from load center 10.

During failure of utility power, operator manipulation of a main switch 32 associated with main breaker 16 electrically isolates utility conductors 12, 14 from load center 10. An interlock member, shown schematically at 33, is positioned to maintain switch 32 in the OFF position, and the switches of generator breaker 26, which are interconnected by a handle tie 34, are then movable to the ON position so as to and electrically connects generator conductors 28, 30 to load center 10. In a manner as is known, interlock member 33 functions to prevent movement of main breaker switch 33 away from the OFF position while the generator breaker switches are in the ON position, to ensures that power provided from generator conductors 28, 30 is not back-fed through utility lines beyond the building via utility conductors 12, 14. Depending in part upon the amount of power provided from generator conductors 28, 30, an operator may selectively configure load center 10 to provide power to critical loads, such as a furnace, sump pump, refrigerator, freezer or the like, by selective manipulation of switches 24 of load breakers 18. Accordingly, a user can configure load center 10 such that the load demand does not exceed the power supplied across generator conductors 28, 30.

Load center 10 includes a power return indicator assembly 40 in accordance with the present invention, which is not electrically connected to the circuits of load center 10. Power return indicator assembly 40 includes an indicator 42, which indicates when utility power is communicated to load center 10 via utility conductors 12, 14. It is appreciated that indicator 42 be any of a visual, acoustical, vibrational, or other sensory indicator. Power return indicator assembly 40 includes a switch 44, which allows an operator to turn power return indicator assembly 40 "ON" and "OFF". A condition indicator 46 is connected to power return indicator assembly 40 and indicates a condition of the power return indicator assembly, such as being "ON" or "OFF". Power return indicator assembly may also include an additional condition indicator 56 that indicates a battery condition. A threaded stem 48 of power return indicator assembly 40 passes through housing 22 of load center 10 and is engaged with a ring nut or the like to secures power return indicator assembly 40 to housing 22. A sensor wire 50 extends from power return indicator assembly 40 through stem 48, and is configured to be positioned in close proximity to one of utility conductors 12, 14. In the illustrated embodiment, sensor wire 50 is wrapped about utility conductor 12.

In operation, during a power outage, an operator manipulates main switch 32 to electrically disconnect utility conductors 12, 14 from load center 10, and manipulates the switches of generator breakers 26 using handle tie 34 to electrically connect generator conductors 28, 30 thereto. The user also turns "ON" power return indicator assembly 40 via switch 44 such that, when utility power is restored, sensor wire 50 senses such power restoration by sensing the electromagnetic field caused by the return of electrical power to utility conductor 12 when voltage is present in utility conductor 12, thereby activating indicator 42. Upon such an indication, a user can shut down the generator associated with generator conductors 28, 30 and reinitiate the electrical connection of load conductors 20 with utility conductors 12, 14 via actuation of main switch 32. Such a construction is effective in reducing the operating time of the generator so that the generator is not operated for an extended duration beyond the restoration of power at utility conductors 12, 14.

Figure 2:
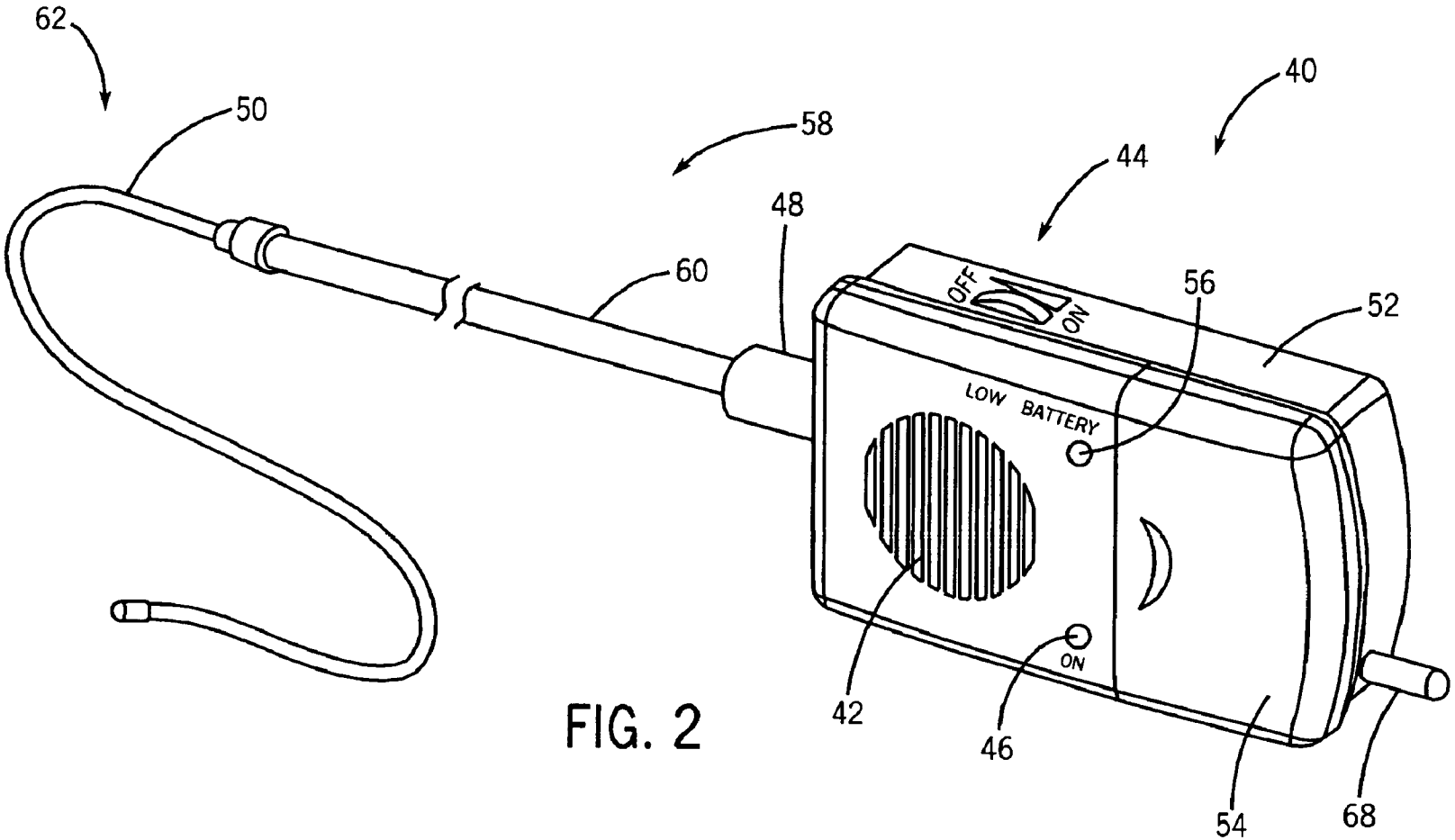
FIG. 2 is a perspective view of the power indicator shown in FIG. 1.

FIG. 2 shows power return indicator assembly 40 removed from load center 10. A housing 52 encloses the majority of the components of power return indicator assembly 40. A removable cover 54 is connected to housing 52 and encloses a battery (not shown). In one embodiment, the battery may be a rechargeable battery. Condition indicator 46, preferably an LED, indicates that switch 44 is in an "ON" position and that power return indicator assembly 40 is thereby activated. An optional battery condition indicator 56, preferably an LED, is also visible through housing 52, and indicates when the batteries of power return indicator assembly 40 need to be replaced or recharged. Alternatively, indicator 42 could be configured to provide an audible alert of a specific tone, frequency, duration, or pattern that indicates a low battery condition. Switch 44 turns power return indicator assembly 40 both "ON" and "OFF" and also controls the volume of indicator 42 in an embodiment in which indicator 42 is an audible indicator.

Sensor wire 50 of power return indicator assembly 40 extends from housing 52 through stem 48. A proximal portion 58 of sensor wire 50 is enclosed within a sheath 60, which isolates the proximal portion 58 of sensor wire 50. In this manner, the sheathed proximal portion 58 of sensor wire 50 prevents inadvertent tripping of power return indicator assembly 40 that otherwise may be caused by sensing of power distributed through load leads 20 when power is provided by generator conductors 28, 30. A distal tip portion 62 of sensor wire 50 is constructed to be positioned in close proximity to one of utility conductors 12, 14. As noted previously, the distal tip portion 62 of sensor wire 50 is wound about one of utility conductors 12, 14. The close proximity of tip portion 62 of sensor wire 50 to utility conductor 12, 14 allows sensor wire 50 to sense the electromagnetic field created about the utility conductors 12, 14 when power is present in utility conductors 12, 14. Accordingly, when sensor wire 50 senses or detects an electromagnetic field about utility conductors 12, 14, power return indicator assembly 40 activates indicator 42 thereby alerting a user that power is present in utility conductors 12, 14. With this construction, power return indicator assembly 40, although physically connected to load center 10, is not electrically connected to utility conductors 12, 14 nor to any circuit of the circuits of load center 10, yet functions to indicates the power condition of utility conductors 12, 14.

Figure 3:
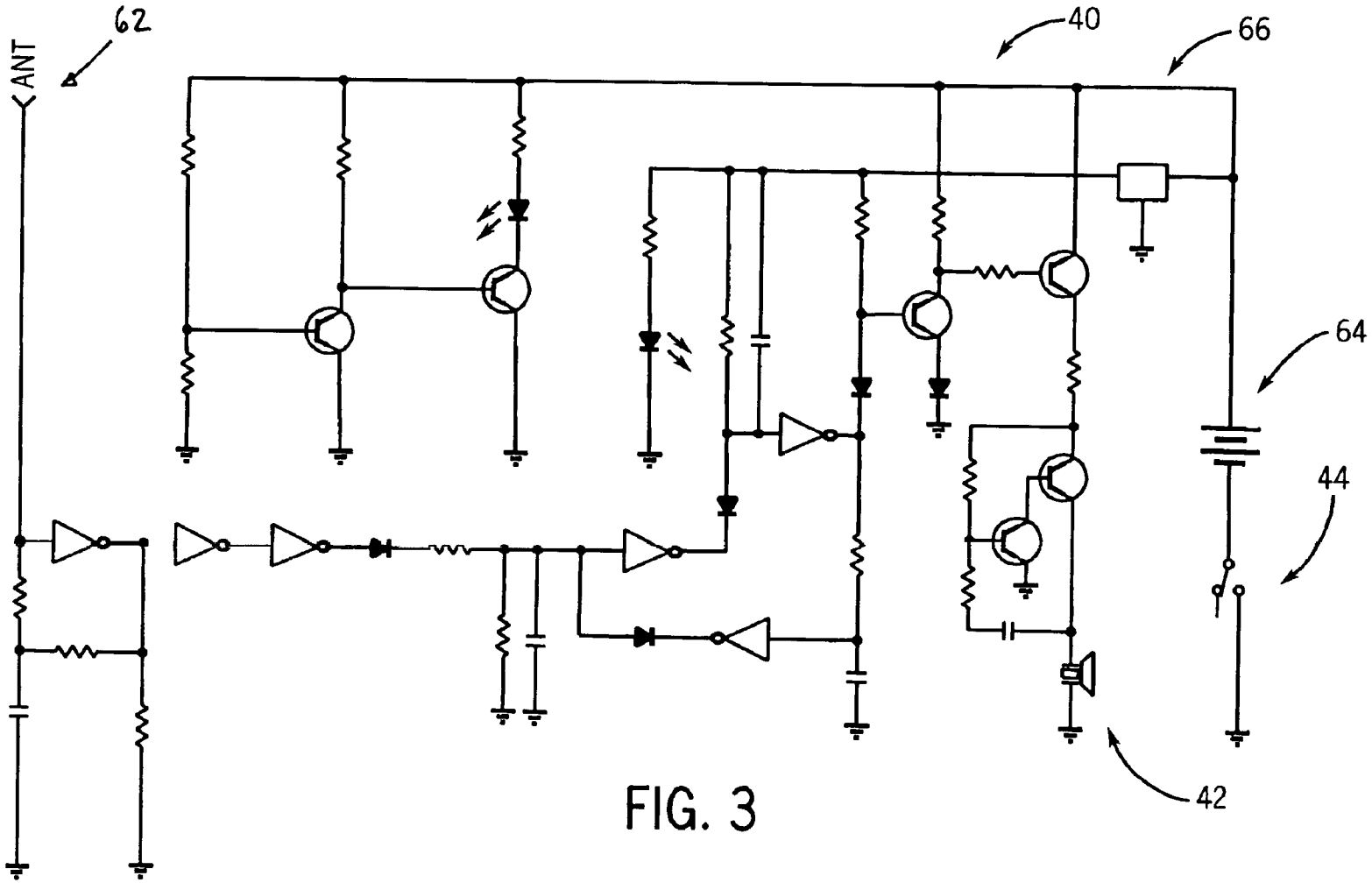
FIG. 3 is a schematic representation of an exemplary circuit of the power indicator shown in FIG. 2.

FIG. 3 shows an exemplary circuit diagram of power return indicator assembly 40. As shown in FIG. 3, switch 44 electrically connects a battery 64 to the circuitry of power return indicator assembly 40, thereby arming a circuit 66 of power return indicator assembly 40. During operation of power return indicator assembly 40, circuit 66 detects the electromagnetic signal associated with power at utility conductors 12 and 14 using distal tip portion 62 of sensor wire 50, which functions as an antenna, and activates indicator 42 upon such detection. Such a construction provides a non-contacting power return indication. It is recognized that other circuit configurations, using various electronic components different from those illustrated herein, may be used.

Referring again to FIG. 1, the power return indicator assembly 40 may optionally include circuitry (not shown) for wirelessly transmitting status information to a remote receiver (not shown). The power return indicator assembly 40 may include an antenna 68 coupled to a transmitter (not shown) that wirelessly transmits a signal to the remote receiver regarding the status of primary power restoration. This allows the user to be remote from the load center 10 yet still be apprized of the status of primary power at the load center. It is contemplated that the receiver may be a desk-top-type device or may be a portable-type device that the user may carry or affix to an article of clothing. It is recognized that other communication techniques may be used to provide status information directly to a user without requiring the user to be proximate the load center. For example, the power return indicator assembly 40 may be interfaced with a building's telephone system and include circuitry that automatically dials one or more telephone numbers when primary power is restored.

In one embodiment, the power return indicator assembly 40 has a battery to provide power to its internal circuitry. It is contemplated that the battery may be a rechargeable battery. It is also contemplated that the battery may be recharged by current induced in a split-core transformer (not shown) positioned near the utility conductor 12. This allows the battery to be charged and connected to the power return indicator assembly 40 when utility power is present across utility conductor 12.

The present invention has been described in terms of the preferred embodiment, and it is recognized that equivalents, alternatives, and modifications, aside from those expressly stated, are possible and within the scope of the impending claims.

What is claimed is:

1. A power indicator constructed to be connected to an electrical enclosure that receives primary power from a main conductor, wherein the electrical enclosure includes one or more walls defining an interior, the power indicator comprising:

a sensor electrically isolated from the main conductor and operative to sense the supply of primary power in the main conductor, wherein the sensor comprises a housing and a sensor wire that extends from the housing, wherein the housing is configured to be secured to one of the walls of the electrical enclosure and wherein the sensor wire is adapted to be positioned adjacent the main conductor and senses the supply of power to the main conductor; and indicator circuitry contained within the housing and connected to the sensor wire, wherein the indicator circuitry is configured to provide a sensory indication of the supply of power to the main conductor.

2. The power indicator of claim 1 wherein the indicator circuitry outputs one of an audible alert, a visual alert, and a vibrational alert when power is sensed at the main conductor.

3. The power indicator of claim 1 wherein the sensor wire is adapted to be wrapped around a portion of the main conductor.

4. The power indicator of claim 3 wherein the sensor wire is constructed such that a signal is induced in the sensor wire when an electric field is present about the main conductor.

5. The power indicator of claim 4 further comprising a battery contained within the housing that provides power to the indicator circuitry.

6. The power indicator of claim 5 wherein the battery is a rechargeable battery.

7. The power indicator of claim 1, further comprising a power source contained within the housing and an ON/OFF switch interconnected with the housing and connected between the power source and the indicator circuitry for selectively providing power to the indicator circuitry from the power source.

8. The power [restoration] indicator of claim 7, wherein the power source comprises a battery.

9. A power restoration indicator for an electrical system that includes an electrical enclosure with one or more walls defining an interior; one or more electrical circuits contained within the interior of the enclosure, and a main conductor extending into the interior of the electrical enclosure and interconnected with the one or more electrical circuits for supplying electrical power to the one or more electrical circuits from a main power supply, wherein the power restoration indictor comprises:

a housing configured to be secured to one of the walls of the electrical enclosure;

a sensor wire that extends from the housing, wherein the sensor wire is electrically isolated from the main conductor and is adapted to be positioned adjacent the main conductor to sense the supply of power to the main conductor;

an alert contained within the housing and interconnected with the sensor wire; and indicator circuitry contained within the housing and connected to the sensor wire, wherein the indicator circuitry is configured to activate the alert when power in the main conductor is detected.

10. The power restoration indicator of claim 9 wherein the sensor wire comprises an antenna that is constructed to sense an electric field generated when power is supplied to the main conductor.

11. The power restoration indicator of claim 10 wherein the alert includes a speaker that provides an audible indication when power is supplied to the main conductor.

12. The power restoration indicator of claim 10 wherein the alert includes an LED that provides a visual indication when power is supplied to the main conductor.

13. The power restoration indicator of claim 9 wherein the sensor wire includes a first portion that is constructed to coil around a portion of the main conductor and a second portion extending from the first portion that is constructed to be routed through the electrical enclosure to the housing.

14. The power restoration indicator of claim 13 wherein the second portion of the wire is sheathed in an insulator.

15. The power restoration indicator of claim 9, further comprising a power source contained within the housing and an ON/OFF switch interconnected with the housing and connected between the power source and the indicator circuitry for selectively providing power to the indicator circuitry from the power source.

16. The power restoration indicator of claim 15, wherein the power source comprises a battery.

17. A power management system comprising:

an electrical enclosure with one or more walls defining an interior; one or more electrical circuits contained within the interior of the enclosure, and a main conductor extending into the interior of the electrical enclosure and interconnected with the one or more electrical circuits for supplying electrical power to the one or more electrical circuits from a primary power supply;

an auxiliary power supply that may provide power to the electrical enclosure during interruption of the primary power supply; and a power restoration indicator electrically isolated from the primary power supply, wherein the power restoration indicator is configured to provide an indication to a user when the primary power supply is operable to provide power to the load center, and wherein the power restoration indicator includes a housing configured to be secured to one of the walls of the electrical enclosure; a sensor wire that extends from the housing, wherein the sensor wire is electrically isolated from the main conductor and is adapted to be positioned adjacent the main conductor to sense the supply of power to the main conductor from the primary power source; an alert contained within the housing and interconnected with the sensor wire; and indicator circuitry contained within the housing and connected to the sensor wire, wherein the indicator circuitry is configured to activate the alert when power in the main conductor from the primary power source is detected.

18. The power management system of claim 17 wherein the sensor wire includes a first portion that is wrapped around a portion of a main conductor that provides primary power to the electrical enclosure from the primary power supply.

19. The power management system of claim 18 wherein the sensor wire senses an electromagnetic field about the main conductor and activates the alert when the electromagnetic field is detected.

20. The power management system of claim 19 wherein the alert is one of an audio alert, visual alert, or vibrational alert.

21. The power management system of claim 19 wherein the sensor wire includes a second portion connected to the first portion and wherein the second portion is sheathed in an insulator.

22. The power management system of claim 19 further comprising a manual transfer switch operable to connect one or more of the electrical circuits to the auxiliary power supply during interruption of the primary power supply.

23. The power management system of claim 17 wherein the power restoration indicator is powered by a battery.

24. A method of indicating a return of primary power in an electrical distribution system that includes an electrical enclosure with one or more walls defining an interior; one or more electrical circuits contained within the interior of the enclosure, and a main conductor extending into the interior of the electrical enclosure and interconnected with the one or more electrical circuits for supplying power from a primary power source through a primary power source conductor to the one or more electrical circuits, comprising the steps of:

non-electrically detecting the presence of primary power in the primary power source conductor via a power restoration indicator, wherein the power restoration indicator includes a housing adapted to be secured to one of the walls of the enclosure and further includes a sensor wire that extends from the housing, wherein the sensor wire is electrically isolated from the main conductor and is adapted to be positioned adjacent the main conductor to sense the supply of power to the main conductor; and activating a sensory alert contained within the housing when the presence of power in the primary power source conductor is detected, wherein the sensory alert is interconnected with the sensor wire and indicator circuitry contained within the housing and connected to the sensor wire, wherein the indicator circuitry is configured to activate the alert when power in the main conductor is detected.

25. The method of claim 24 wherein the step of non-electrically detecting the presence of power in the primary power supply conductor is carried out by detecting a magnetic field about the primary power source conductor.

26. The method of claim 24, further comprising a power source contained within the housing and including the step of operating an ON/OFF switch interconnected with the housing and connected between the power source and the indicator circuitry for selectively providing power to the indicator circuitry from the power source.

27. The method of claim 26, wherein the power source comprises a battery.

*28. A power restoration indicator constructed to be connected to an electrical enclosure that receives primary power from a main conductor, comprising:*

*a sensor operative to sense the supply of primary power in the main conductor;*

*indicator circuitry operatively coupled to the sensor and including a wireless transmitter; and*

*a remote receiver configured to receive a signal from the wireless transmitter, wherein the remote receiver is configured to provide a sensory indication of the supply of power to the main conductor.*

*29. The power restoration indicator of claim 28, further comprising an antenna coupled to the wireless transmitter configured to wirelessly transmit the signal to the remote receiver in response to the supply of power to the main conductor.*

*30. The power restoration indicator of claim 28, wherein the remote receiver includes a battery.*

*31. A method of indicating a return of primary power in an electrical distribution system comprising the steps of:*

*detecting the presence of primary power in a primary power source conductor;*

*wirelessly transmitting a signal in response to the detection of primary power in the main conductor;*

*receiving the wirelessly transmitted signal at a remote receiver; and*

*providing a sensory indication to a user of the remote receiver as to the return of primary power to the primary power source conductor.*

*32. The method of claim 31, wherein the remote receiver includes a power source.*

*33. The method of claim 32, wherein the power source of the remote receiver is a battery.*

*34. The method of claim 31, wherein the signal is transmitted via a wireless transmitter that includes an antenna configured to wirelessly transmit the signal to the remote receiver.*

* * * * *